United States Patent
Balakrishnan et al.

(10) Patent No.: US 9,524,969 B1
(45) Date of Patent: Dec. 20, 2016

(54) INTEGRATED CIRCUIT HAVING STRAINED FINS ON BULK SUBSTRATE

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/811,887

(22) Filed: Jul. 29, 2015

(51) Int. Cl.
| | |
|---|---|
| *H01L 27/00* | (2006.01) |
| *H01L 29/06* | (2006.01) |
| *H01L 29/78* | (2006.01) |
| *H01L 29/16* | (2006.01) |
| *H01L 27/092* | (2006.01) |
| *H01L 21/8238* | (2006.01) |
| *H01L 21/02* | (2006.01) |
| *H01L 29/165* | (2006.01) |

(52) U.S. Cl.
CPC ....... *H01L 27/0924* (2013.01); *H01L 21/0245* (2013.01); *H01L 21/0251* (2013.01); *H01L 21/02255* (2013.01); *H01L 21/02381* (2013.01); *H01L 21/02532* (2013.01); *H01L 21/823821* (2013.01); *H01L 21/823878* (2013.01); *H01L 27/0922* (2013.01); *H01L 29/0642* (2013.01); *H01L 29/165* (2013.01); *H01L 29/7849* (2013.01)

(58) Field of Classification Search
CPC ............. H01L 27/0924; H01L 27/0922; H01L 29/0642; H01L 29/165; H01L 29/7849
See application file for complete search history.

(56) References Cited

U.S. PATENT DOCUMENTS

| | | |
|---|---|---|
| 6,707,106 B1 | 3/2004 | Wristers et al. |
| 6,906,400 B2 | 6/2005 | Delhougne et al. |
| (Continued) | | |

OTHER PUBLICATIONS

P. Hashemi et al., "High-Mobility High-Ge-Content Si1-xGex-OI PMOS FinFETs with Fins Formed Using 3D Germanium Condensation with Ge Fraction up to x~ 0.7, Scaled EOT~8.5A and ~10nm Fin Width", 2015 Symposium on VLSI Technology Digest of Technical Papers.

*Primary Examiner* — Ida M Soward
(74) *Attorney, Agent, or Firm* — Harrington & Smith; Louis J. Percello

(57) ABSTRACT

A method includes forming a set of fins composed of a first semiconductor material. The method further heats the set of fins to condense the fins and cause growth of a layer of oxide on vertical sidewalls thereof, masking a first sub-set of the fins, forming a plurality of voids in the oxide by removing a second sub-set of fins, where each void has a three-dimensional shape and dimensions that correspond to a three dimensional shape and dimensions of a corresponding removed fin from the second sub-set, and epitaxially growing in the voids a third sub-set of fins. The third sub-set of fins is composed of a second semiconductor material that differs from the first semiconductor material. Each fin of the third subset has a three dimensional shape and dimensions of a corresponding removed fin from the second sub-set. At least one structure formed by the method is also disclosed.

3 Claims, 8 Drawing Sheets

(56) References Cited

U.S. PATENT DOCUMENTS

| | | | |
|---|---|---|---|
| 7,022,593 B2 | 4/2006 | Arena et al. | |
| 7,202,512 B2 | 4/2007 | Chen et al. | |
| 7,250,357 B2 | 7/2007 | Senda et al. | |
| 7,341,929 B2 | 3/2008 | Tseng et al. | |
| 7,705,345 B2 | 4/2010 | Bedell et al. | |
| 8,766,364 B2 * | 7/2014 | Doornbos | H01L 21/823807 257/351 |
| 8,841,178 B1 | 9/2014 | Basker et al. | |
| 8,841,185 B2 * | 9/2014 | Khakifirooz | H01L 27/0805 257/308 |
| 8,878,309 B1 * | 11/2014 | Hong | H01L 27/0886 257/330 |
| 8,928,083 B2 * | 1/2015 | Chang | H01L 29/861 257/350 |
| 8,941,156 B2 * | 1/2015 | Bergendahl | H01L 29/7855 257/288 |
| 8,963,259 B2 * | 2/2015 | Jacob | H01L 21/761 257/328 |
| 8,987,082 B2 * | 3/2015 | Loubet | H01L 21/82348 438/212 |
| 9,040,371 B2 * | 5/2015 | Cheng | H01L 27/0886 438/197 |
| 9,129,905 B2 * | 9/2015 | Hu | H01L 21/3086 |
| 9,142,418 B1 * | 9/2015 | Jung | H01L 21/3081 |
| 9,165,945 B1 * | 10/2015 | Sadaka | H01L 27/1211 |
| 9,177,820 B2 * | 11/2015 | Bergendahl | H01L 21/3086 |
| 9,184,100 B2 * | 11/2015 | Tsai | H01L 21/82382 |
| 9,190,419 B2 * | 11/2015 | Chang | H01L 29/861 |
| 9,269,628 B1 * | 2/2016 | Jacob | H01L 21/823431 |
| 9,305,846 B2 * | 4/2016 | Jacob | H01L 21/761 |
| 9,306,036 B2 * | 4/2016 | Ganz | H01L 29/66795 |
| 9,318,491 B2 * | 4/2016 | Cantoro | H01L 27/0924 |
| 9,368,498 B2 * | 6/2016 | Eneman | H01L 29/1054 |
| 9,455,274 B2 | 9/2016 | Doris et al. | |
| 2006/0157732 A1 | 7/2006 | Von Kaenel et al. | |
| 2009/0026543 A1 * | 1/2009 | Yang | H01L 21/845 257/365 |
| 2011/0244668 A1 * | 10/2011 | Narihiro | H01L 27/1203 438/479 |
| 2012/0068267 A1 | 3/2012 | Bedell et al. | |
| 2013/0196485 A1 * | 8/2013 | LiCausi | H01L 21/823821 438/478 |
| 2014/0353760 A1 | 12/2014 | Loubet et al. | |
| 2014/0353767 A1 | 12/2014 | Liu et al. | |
| 2014/0357060 A1 | 12/2014 | Liu et al. | |
| 2015/0126008 A1 * | 5/2015 | Paul | H01L 21/82343 438/283 |
| 2016/0005864 A1 * | 1/2016 | Kwon | H01L 29/7848 257/190 |
| 2016/0027779 A1 * | 1/2016 | Loo | H01L 29/165 257/190 |
| 2016/0027876 A1 * | 1/2016 | Lee | H01L 29/1054 257/369 |
| 2016/0035727 A1 * | 2/2016 | Brunco | H01L 27/0924 257/369 |
| 2016/0086841 A1 * | 3/2016 | Song | H01L 21/76224 438/424 |
| 2016/0099352 A1 * | 4/2016 | Lee | H01L 29/7851 257/192 |
| 2016/0104799 A1 * | 4/2016 | Qi | H01L 29/7849 257/29 |
| 2016/0118472 A1 * | 4/2016 | Qi | H01L 29/6681 438/283 |
| 2016/0190304 A1 * | 6/2016 | Morin | H01L 29/785 257/347 |

* cited by examiner

INTEGRATED CIRCUIT HAVING STRAINED FINS ON BULK SUBSTRATE

TECHNICAL FIELD

The various embodiments of this invention relate generally to semiconductor devices and fabrication techniques and, more specifically, relate to the fabrication of fin FET semiconductor transistor devices wherein the fins are strained and disposed on strained relaxed buffer and a substrate, such as a bulk silicon substrate.

BACKGROUND

Tensile strained silicon (s-Si) enhances electron mobility by lifting the conduction band degeneracies, reducing carrier scattering and increasing the population of carriers in sub-bands with lower transverse effective mass. A strain relaxed buffer (SRB) is an important element when fabricating strained channel CMOS transistors. As an example, a SiGe SRB can be used when growing on a substrate a tensile strained Si channel for nFET devices and a compressively strained Ge, or high Ge percentage $Si_{1-x}Ge_x$ (e.g., where x=0.50), for pFET devices.

SUMMARY

In a first aspect thereof the embodiments of this invention provide a method that comprises forming a set of fins in a top portion of a semiconductor layer, the set of fins being comprised of a first semiconductor material. The method further includes heating the set of fins to cause condensation of the fins and growth of an oxide at least on vertical side surfaces thereof. The method further comprises masking a first sub-set of the set of fins and forming a plurality of voids in the oxide by removing a second sub-set of the set of fins, where each void has a three-dimensional shape and dimensions that correspond to a three dimensional shape and dimensions of a corresponding removed fin from the second sub-set of fins. The method further comprises epitaxially growing in the voids a third sub-set of fins. The third sub-set of fins are comprised of a second semiconductor material that differs from the first semiconductor material, where each fin of the third subset of fins has a three dimensional shape and dimensions of a corresponding removed fin from the second sub-set of fins. In another aspect thereof the embodiments of this invention provide a method that comprises providing a substrate having on a top surface thereof an overlying semiconductor layer. The overlying semiconductor layer is comprised of a strain relaxed buffer (SRB) comprised of a layer of $Si_{1-x}Ge_x$, where x has a non-zero value=n. The method further comprises defining a plurality of fins in a top portion of the layer of $Si_{1-x}Ge_x$; annealing the defined plurality of fins to form a set of condensed $Si_{1-x}Ge_x$ fins, where x has a value=m, where m>n, where the step of annealing forms an oxide that covers at least vertical surfaces of individual ones of the set of condensed $Si_{1-x}Ge_x$ fins; masking a first sub-set of the set of condensed $Si_{1-x}Ge_x$ fins; forming a plurality of voids in the oxide by a step of removing a second sub-set of the set of condensed $Si_{1-x}Ge_x$ fins, each void having a three-dimensional shape and dimensions that correspond to a three dimensional shape and dimensions of a corresponding removed fin from the second sub-set of the set of condensed $Si_{1-x}Ge_x$ fins; and epitaxially growing strained Si in the voids to form a third sub-set of fins, where each fin of the third subset of fins has a three dimensional shape and dimensions Of a corresponding removed fin from the second sub-set of fins.

In a further non-limiting aspect thereof the embodiments of this invention provide a structure that comprises a strain relaxed buffer disposed on a surface of a substrate; a set of fins disposed on a surface of the strain relaxed buffer, where the set of fins is comprised of a first subset of fins comprised of $s-Si_{1-x}Ge_x$ and a second subset of fins comprised of s-Si. The strain relaxed buffer is comprised of $Si_{1-x}Ge_x$, where x has a non-zero value=n, and where the first subset of fins are comprised of $Si_{1-x}Ge_x$, where x has a value=m, where m>n. The structure further comprises a layer disposed in a top surface portion of the strain relaxed buffer of $Si_{1-x}Ge_x$, the layer being disposed at least between individual fins of the set of fins, where x in the layer has the value=m.

BRIEF DESCRIPTION OF THE SEVERAL VIEWS OF THE DRAWINGS

FIG. 1 illustrates a starting structure comprised of a bulk Si substrate, an overlying SiGe graded region, a SiGe SRB formed on the graded region and an overlying hard mask;

FIG. 2 shows the structure of FIG. 1 after photolithographic patterning and etching to forma first plurality of SiGe fins in a top-most portion of the SiGe SRB;

FIG. 3 shows the structure of FIG. 2 after performing a thermal anneal operation to cause an enriched concentration of Ge in the first SiGe fins thereby forming second SiGe fins having a reduced width, and increased Ge concentration and an overlying layer of thermal silicon oxide;

FIG. 4 shows the structure of FIG. 3 after masking a PFET region, removing the hard mask in an NFET region, and removing exposed condensed $Si_{1-x}Ge_x$ fins within the NFET region forming voids (oxide molds) in the thermal silicon oxide;

FIG. 5 shows the structure of FIG. 4 after epitaxially growing s-Si in the oxide molds formed in FIG. 4, thereby forming s-Si fins;

FIG. 6 shows the structure of FIG. 5 after removing the hard mask in the PFET region and removing the thermal silicon oxide leaving free-standing Ge-enriched $Si_{1-x}Ge_x$ fins and s-Si fins; and FIG. 7 shows the structure of FIG. 6 after performing an oxide refill and recess process to form a dielectric layer having a thickness that establishes the final height of the Ge-enriched $Si_{1-x}Ge_x$ fins and the s-Si fins.

DETAILED DESCRIPTION

Figure 1:
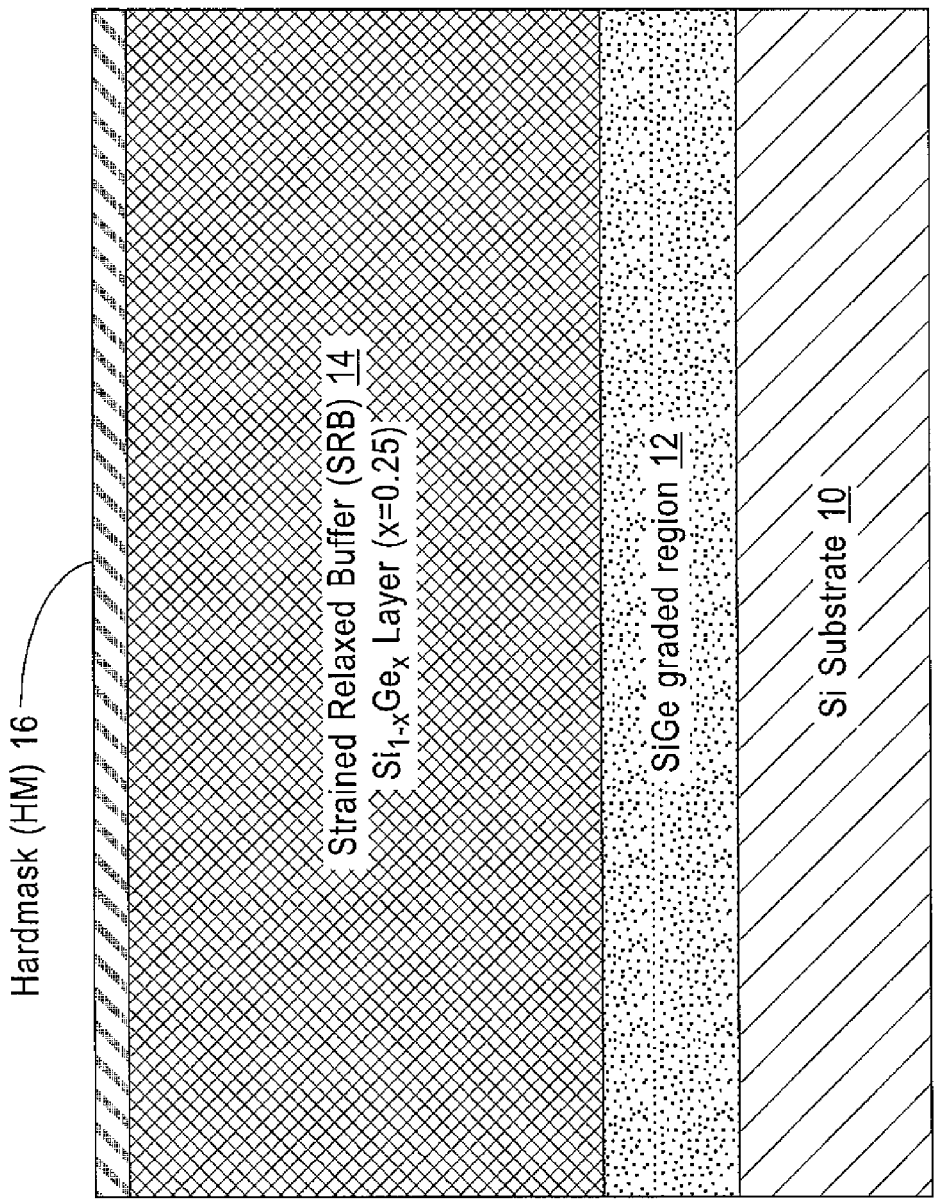
FIGS. 1-7 are each an enlarged cross-sectional view showing various initial, intermediate and completed or substantially completed structures that are fabricated in accordance with embodiments of this invention, wherein the various layer thicknesses and other dimensions are not necessarily drawn to scale. More specifically.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses and methods that are suitable for use in implementing the embodiments of this invention can include, but are not limited to, chemical vapor deposition (CVD) such as, for example, rapid thermal chemical vapor deposition (RTCVD), atmospheric pressure chemical vapor deposition (APCVD), low pressure chemical vapor deposition (LPCVD) and ultra-high vacuum chemical vapor deposition (UHVCVD). Other suitable epitaxial growth processes can include, but are not limited to, molecular beam epitaxy (MBE) and low-energy plasma deposition (LEPD). The temperature for an epitaxial deposition process typically ranges from about 550° C. to about 900° C. Although higher temperature will typically result in faster deposition of the semiconductor material, the faster deposition may also result in crystal defects and film cracking. Global strain engineering using strained Si (s-Si) for n-type FETs (nFETs) and strained silicon-germanium (s-$Si_{1-x}Ge_x$) for p-type FETs (pFETs) is a viable option for fabricating small geometry bulk finFETs for high-performance applications. One suitable candidate is s-Si on a 25% strain relaxed buffer (SRB), which exhibits about 1% tensile strain for nFETs, and about 50% s-$Si_{1-x}Ge_x$, x=0.50, on a 25% SRB that results in about 1% compressive strain for pFETs.

One problem with fin definition when employing a commonly used reactive ion etch (RIE) process is that the critical dimension (CD) loss during RIE can be 3 nm-4 nm greater for SiGe 50% that for Si. In addition, surface preparation and cleaning using a wet chemical process can also result in more CD loss for SiGe than for Si. The end result is a fin width for n-type FETs that can differ from the fin width for p-type FETs. This difference in fin width can be detrimental to transistor device performance, at least for the reason that device electrostatics, to a first order, scale with the fin width.

The exemplary embodiments of this invention provide a novel method to overcome the foregoing and other problems. A SRB is made available for the substrate for small geometry devices (e.g., 7 nm devices) and SiGe fins are defined on the SRB with arbitrary height determined by the RIE process. A shallow trench isolation (STI) process can be employed to form recesses. The SiGe fins are condensed by a thermal process to form SiGe fins with reduced dimensions (e.g., from 12 nm-14 nm to 6 nm-7 nm). In the nFET region the SiGe fin is removed thereby, creating an oxide mold in which to grow s-Si fins with the same dimensions as the SiGe fins in the pFET region. Using this process the nFET fin width is the same as the pFET fin width, there is no or minimal RIE damage experienced and, as compared to a replacement fin process for both nFET and pFET regions, the method has the advantage of one less lithography step, epitaxial deposition (epi) step and chemical mechanical polish (CMP) step.

It should be appreciated that if the three dimensional SiGe condensation process happens to result in by example, a concave or a convex shape for the s-SiGe pFET fins, then the same shape is produced for the s-Si nFET fins grown in the oxide mold made from those removed pFET fins that were formed in what will be the nFET region. As a result similar electrostatics result for both types of devices FIG. 1 illustrates a starting structure comprised of a bulk Si substrate 10, an overlying graded SiGe region 12 formed on the Si substrate 10 and a SRB 14 formed on the graded region 12. The Si substrate 10 can have any desired thickness. During epitaxial growth of the $Si_{1-x}Ge_x$ graded region the value of x is gradually or step-wise increased in the vertical direction during epitaxial growth from about zero to a value desired in the SRB 14, or in this non-limiting embodiment about 0.25. A total thickness of the graded region 12 can be in a range of about 500 nm to about 2 μm. A total thickness of the epitaxially grown SRB 14 can be in a range of about 50 nm to about 500 nm, with about 200 nm being a nominal thickness that is useful for many embodiments. Over the SRB 14 is deposited by conventional means a hardmask (HM) layer 16, typically a nitride.

Figure 2:
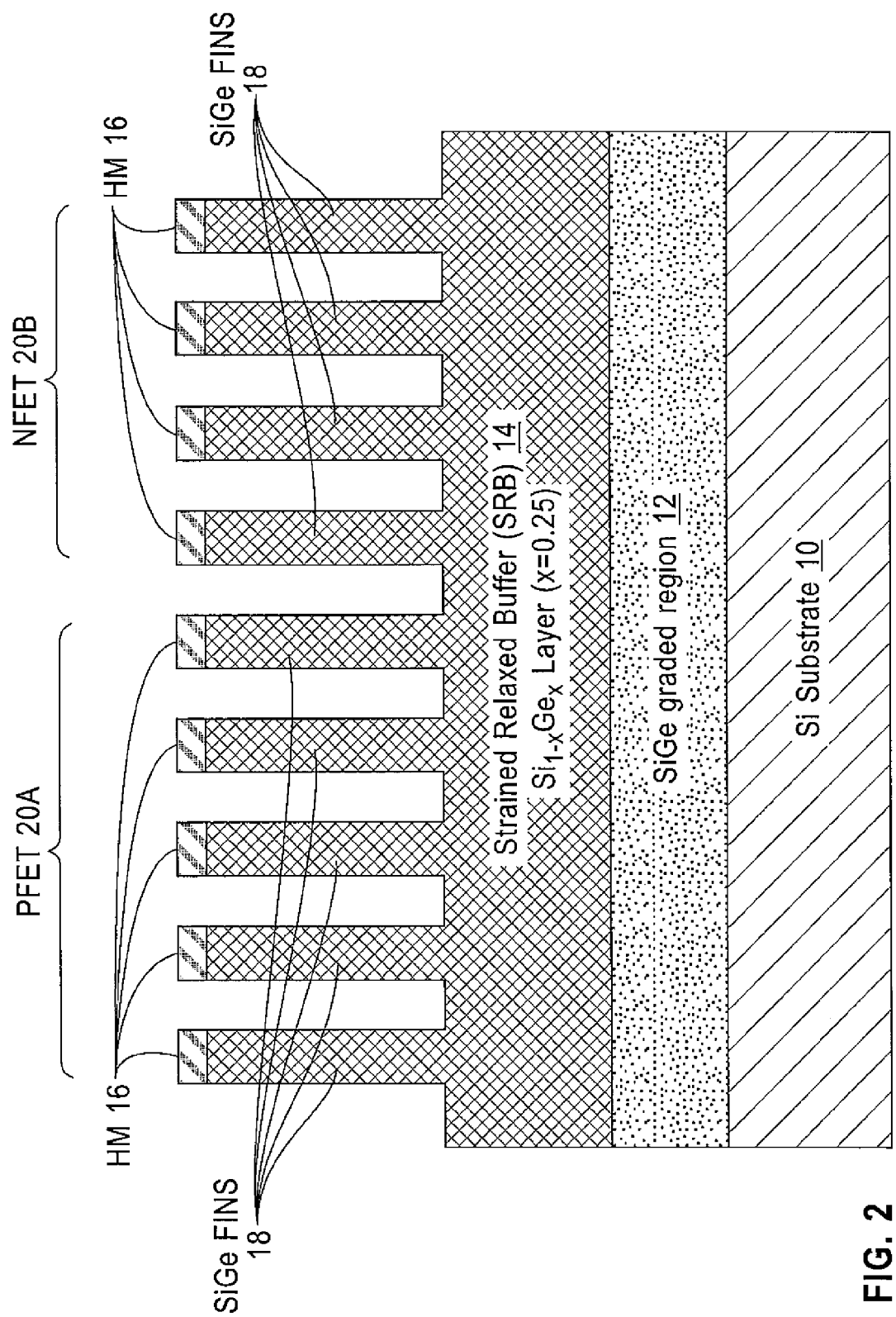

FIG. 2 shows the structure of FIG. 1 after photolithographic patterning and etching to form a plurality of SiGe fins 18 in a top-most portion of the SiGe SRB 14. The initial fin height can be, for example, in a range of about 50 nm to about 70 nm and, considering an exemplary 28 nm fin pitch (distance between adjacent fins), the initial fin width (WFIN) can be in an exemplary range of about 12 nm to about 14 nm. Note that the same SiGe fins 18 are present in what will be a PFET region 20A of the wafer and what will be an NFET region 20B.

Figure 3:
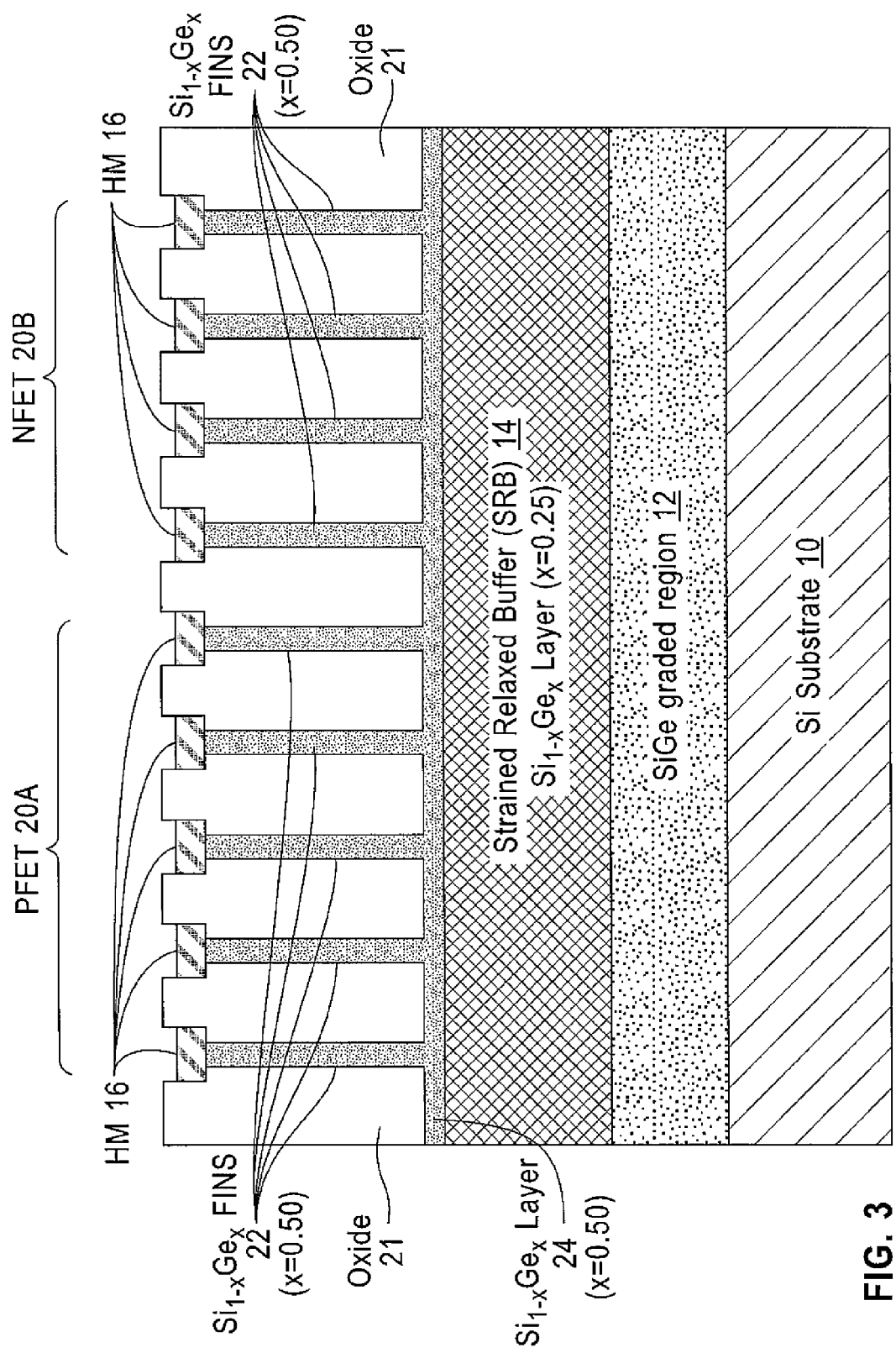

FIG. 3 shows the structure of FIG. 2 after performing a thermal anneal operation. A suitable but not limiting range of temperature is about 700° C. to about 1000° C. for a period of some minutes. In a case where the anneal process involves oxidation, the oxygen reacts with silicon in the SiGe fins 18 to form thermal silicon oxide 21. Meanwhile, Ge is repelled towards the core of the fins 18. As a result, the Ge concentration in a final SiGe fin 22 is increased after oxidation. Such a Ge enrichment process can be referred to without limitation as "condensation". In the condensed (Ge enriched) $Si_{1-x}Ge_x$ fins 22 the value of x can be, for example, about 0.50, and the fin width (not considering the overlying oxide 21, is reduced by the oxidation process from a starting value of, for example, about 12 nm-14 nm to a final value of, for example, about 6 nm-7 nm.

It can be noted that as a result of the anneal and condensation process that there is formed a layer 24 of Ge-enriched $Si_{1-x}Ge_x$ on the top surface of the SRB 14, where the value of x in the layer 24 is comparable to or smaller than the value of x in the fins 22, or comparable to or smaller than about 0.50 in this non-limiting example. The layer 24 of Ge-enriched $Si_{1-x}Ge_x$ is also covered with the layer of thermal oxide 21. In the embodiments of this invention the layer 24 of Ge-enriched $Si_{1-x}Ge_x$ can be retained in the final structure as it does not have a detrimental effect on device performance. The thickness of the layer 24 can be comparable to or less than the width of the Ge-enriched portions of the fins, or about 6 nm-7 nm or less.

It should also be noted that the condensation process can also enhance the critical thickness of the higher Ge concentration SiGe beyond what would typically be obtained from conventional blanket epitaxial growth. One exemplary benefit of using the condensation process is that the fin height can be increased in a case where the hard mask 18 is not present, since the condensation process can result in the Ge-enriched also growing (unconstrained by the HM 18) in the vertical direction (as referenced to the top surface of the SRB 14).

Figure 4:
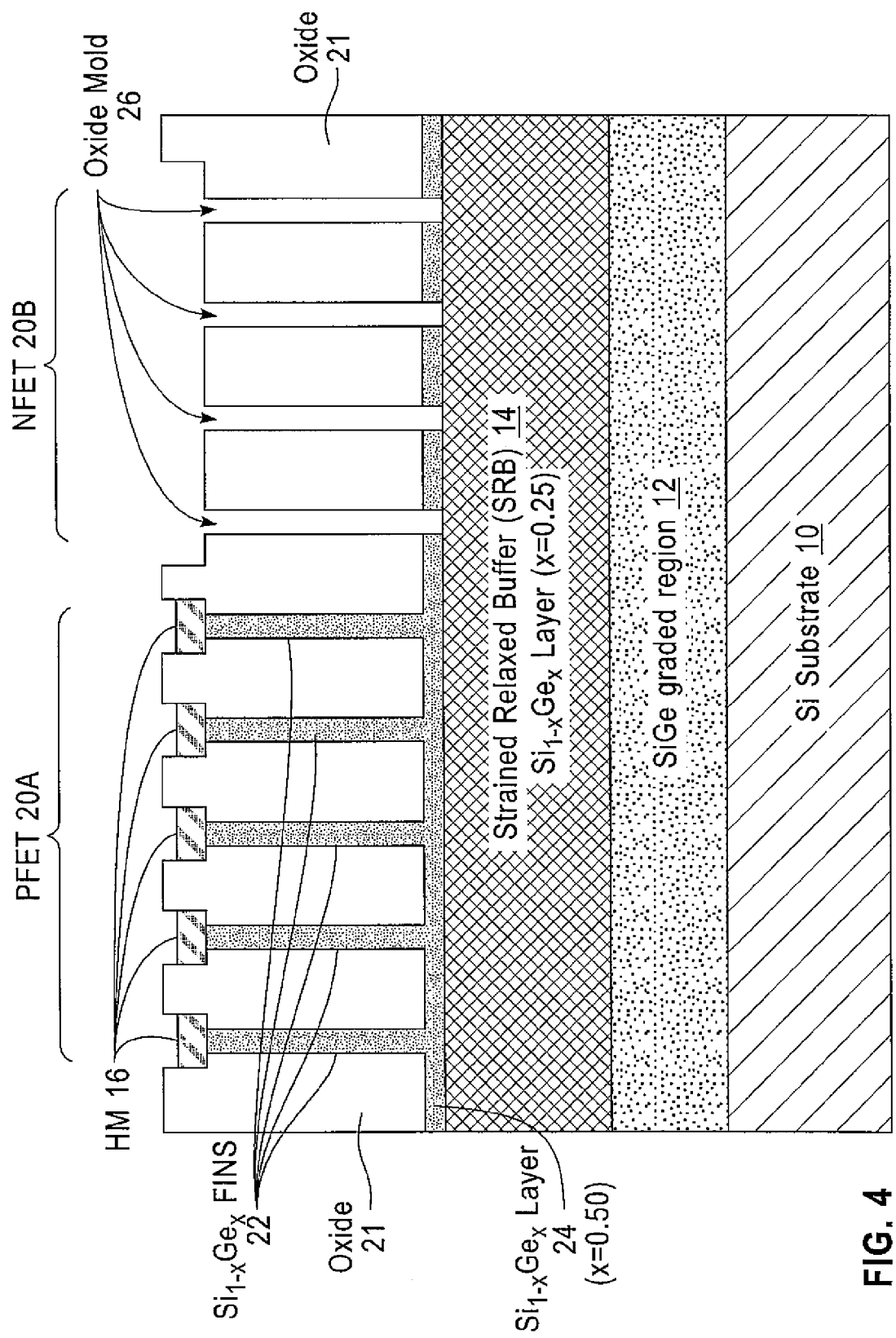

FIG. 4 shows the structure of FIG. 3 after performing several sequential operations. A first operation forms a mask (not shown) over the HMs 16 in the PFET region 20A, followed by removal of the HMs 16 in the NFET region 20B (if not previously removed before the condensation process of FIG. 3). This can be accomplished by any suitable nitride removal process, such as by the use of a wet etch with a hot phosphoric acid or an RIE process that is selective to the underlying Ge-enriched $Si_{1-x}Ge_x$, material of the fins 22. This exposes the top surface of the condensed $Si_{1-x}Ge_x$ fins 22 within the NFET region 20B. Next the exposed condensed fins 22 within the NFET region 20B are removed such as by an RIE process. A wet HCl based etch process can be used, or a gas phase HCl etch process can be used to remove the $Si_{1-x}Ge_x$ fins 22 within the NFET region 20B. The end result is the formation of voids in the thermal silicon oxide 21 where the enriched $Si_{1-x}Ge_x$ material of the fins 22 is removed. These voids can be considered to form oxide molds 26 having a three dimensional shape that conforms to the three dimensional shape of the removed SiGe fins 22. It can be noted that the voids (oxide molds 26) extend through the underlying SiGe layer 24 to the top surface of the SRB 14. The mask applied over the PFET region 22A can be retained or it can be removed and reapplied for the next processing step shown in FIG. 5.

Figure 8C:
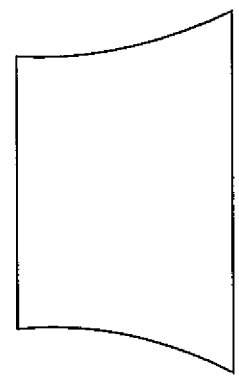
FIGS. 8A-8C illustrate three non-limiting cross-sectional examples of three dimensional shapes that the voids (oxide molds) of FIG. 4 can assume, and into which s-Si can be regrown.
Figure 8B:
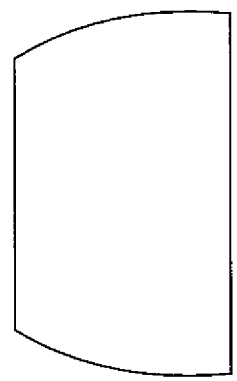
Figure 8A:
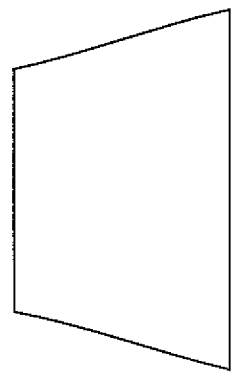

The voids, and hence the oxide molds 26, can assume any three dimensional shape and dimensions that conform to the three dimensional shape and dimensions of the removed SiGe fins 22. Referring to FIGS. 8A-8C there are shown three non-limiting examples of such three dimensional shapes (shown in cross-section) which can include concave (FIG. 8A), convex (FIG. 8B) and approximately trapezoidal (FIG. 8C). Fins having an approximately triangular shape can also be formed.

Figure 5:
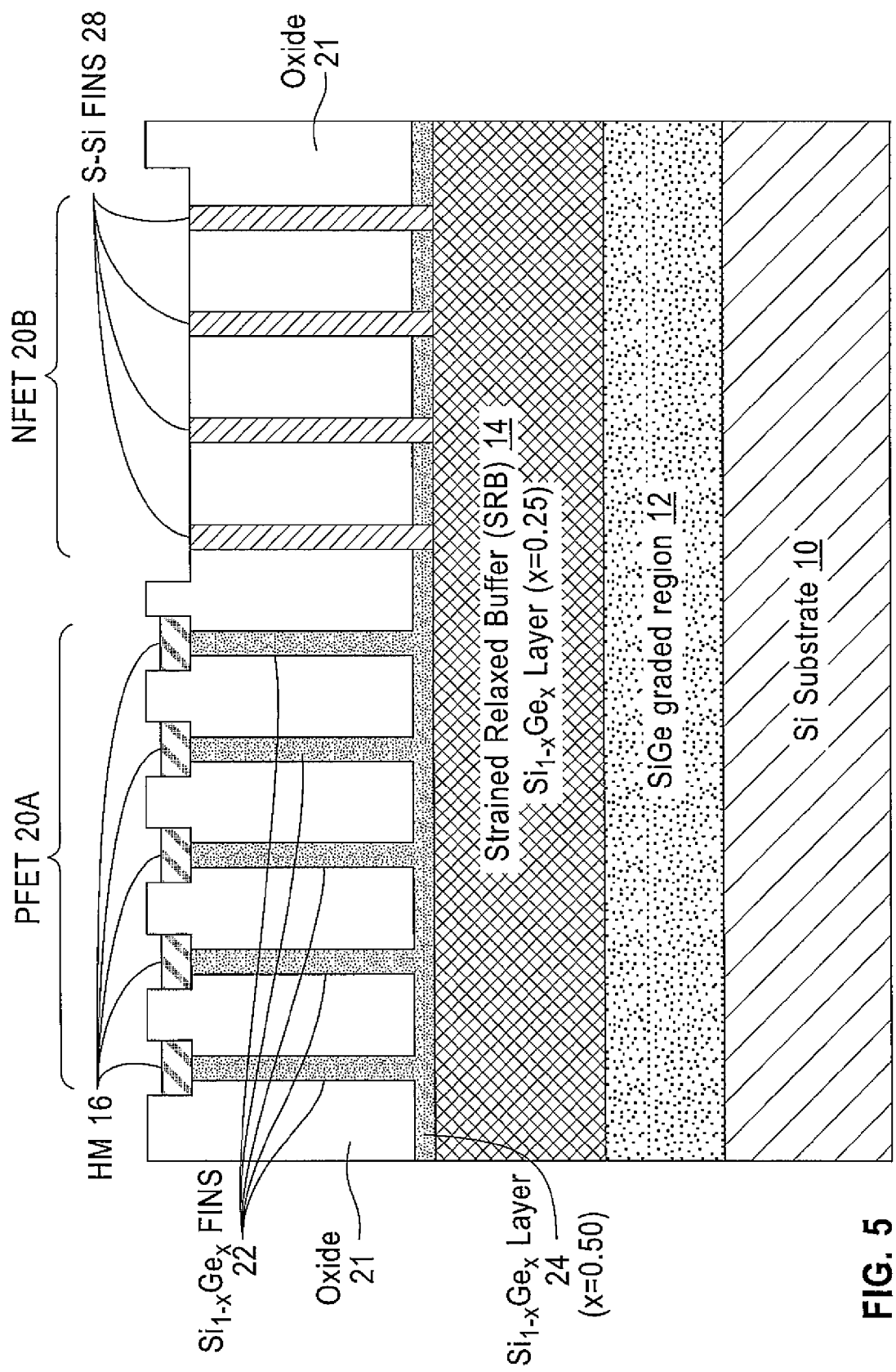

FIG. 5 shows the structure of FIG. 4 after epitaxially growing s-Si in the oxide molds 26, thereby forming s-Si fins 28. In accordance with an aspect of this invention the s-Si fins 28 have a three dimensional shape and dimensions that correspond to the three dimensional shape and dimensions of the oxide molds 26 corresponding to the previously removed (in FIG. 4) Ge-enriched $Si_{1-x}Ge_x$ fins 22. RTCVD and LPCVD are two non-limiting example of epitaxial growth processes that can be used to fill the molds 26 with s-Si to form the s-Si fins 28 in the NFET region 20B.

Figure 6:
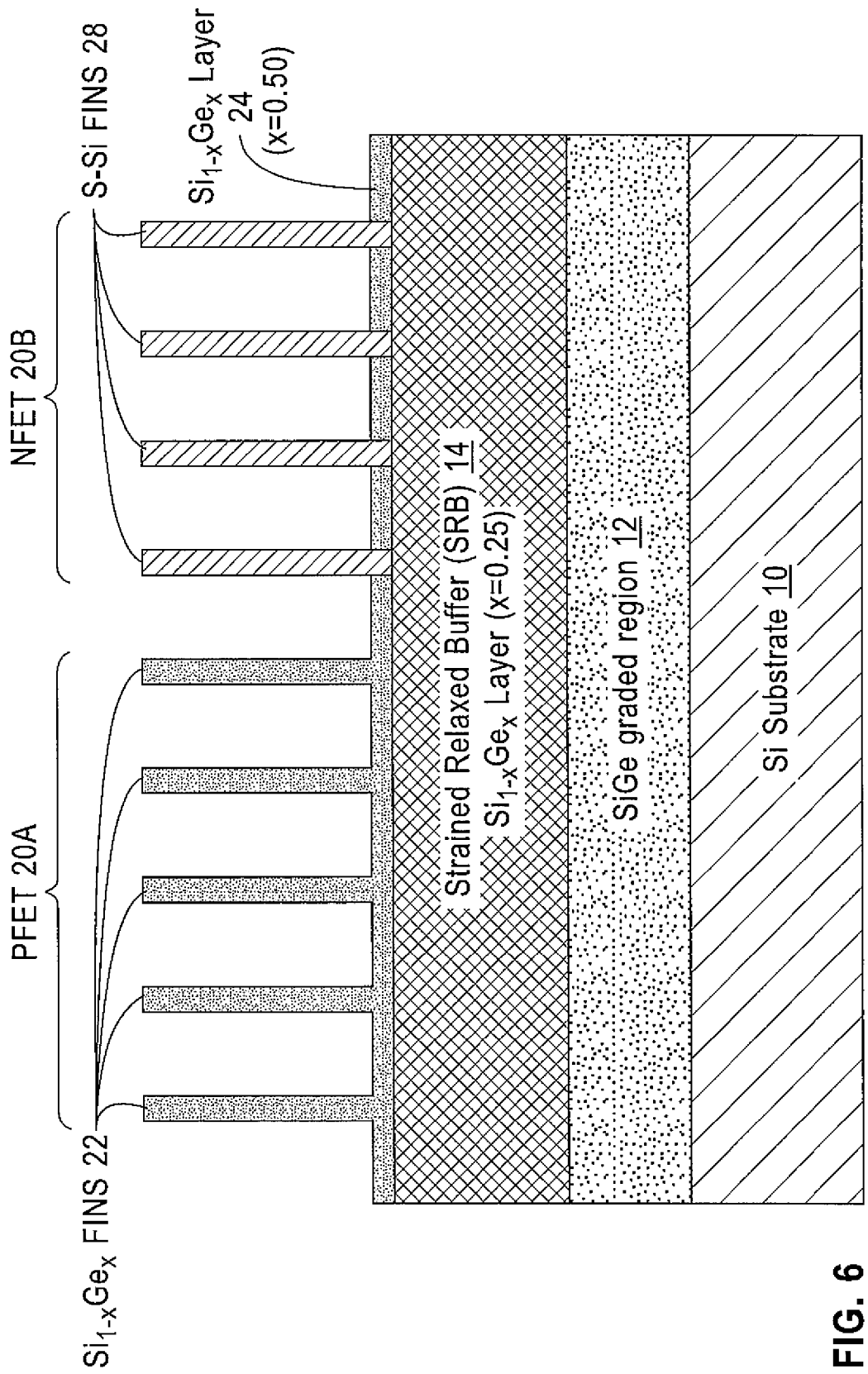

FIG. 6 shows the structure of FIG. 5 after removing the HM 16 in the PFET region 20A and removing the thermal silicon oxide 21, thereby leaving the free-standing Ge-enriched $Si_{1-x}Ge_x$ fins 22 and the s-Si fins 28. The layer of thermal silicon oxide 21 can be removed from the fin sidewalls and the surface of the layer 24 by any suitable oxide etch process such a wet etch containing diluted hydrofluoric acid.

To provide electrical isolation the bottom portions of the fins 22 and 28 can be doped (counter-doped). In practice a first mask (not shown) can be applied to cover the NFET region 20B followed by a doping process, e.g., a solid phase, punch through stopper doping (PTS) process, in the PFET region 20A to dope at least the top-most portion of the SRB 14 (and the overlying layer 24), and possibly the lower-most portion of the fins 22, to be an N-type region. The PTS in essence provides at the bottom of the fin a doped layer or region of opposite polarity that enhances electrical isolation of the fins 22. The doping process can use, for example, solid phase doping or ion implantation, and suitable N-type dopant species can be, for example, As or P. The first mask is then removed and a second mask applied to cover the PFET region 20A. This is followed by another PTS process performed in the NFET region 20B to dope the top-most portion of the SRB 14 (and the overlying layer 24), and possibly the lower-most portion of the fins 28, to be a P-type region thus enhancing electrical isolation of the fins 28. This doping process can also use, for example, solid phase doping or ion implantation, and a suitable P-type dopant species can be, for example, Boron.

Figure 7:
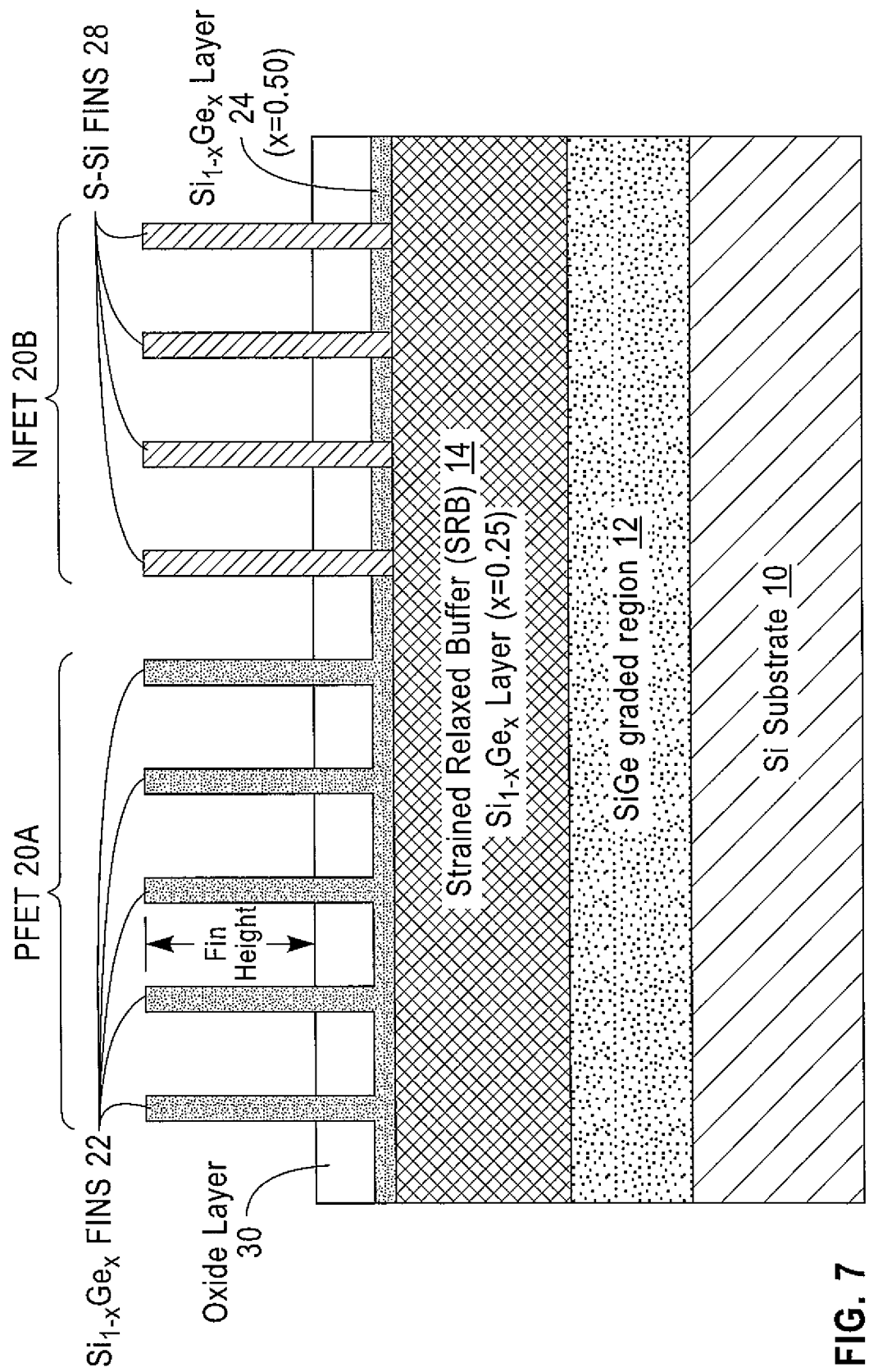

FIG. 7 shows the structure of FIG. 6 after performing an oxide refill and recess process to form a dielectric layer 30, such as a layer of $SiO_2$, on the surface of the layer 24. Plasma enhanced CVD (PECVD) is one suitable technique to grow the $SiO_2$ layer 30. The final thickness of the $SiO_2$ layer 30 can be adjusted by using a wet chemical etch (e.g., a HF etch). The final thickness of the $SiO_2$ layer 30 governs the final height of the fins 22 and 28. As a non-limiting example, the fins 22 and 28 can have a height, measured from the top surface of the $SiO_2$ layer 30, in a range of about 30 nm to about 40 nm, with about 35 nm being one suitable nominal value.

Processing can then continue in a conventional fashion to form gate dielectrics (e.g., oxide, hi-k, $AlO_x/HfO_2$) and gates (metal or replacement followed by metal) on the fins 22 and 28, suitably doped source and drain (S/D) regions for the fins 22 and 28, and any other desired processing including for example dielectric fill (e.g., MOL), CMP and polish, metallization and other conventional processing steps needed to form functional PFET and NFET devices.

In a completed integrated circuit, in accordance with this non-limiting embodiment, there exist the plurality of nFETs comprised of the s-Si fins 28 on the 25% SRB 14, which exhibits about 1% tensile strain for the nFETs, and there exist the plurality of pFETs comprised of the $s-Si_{1-x}Ge_x$, x=0.50, on the 25% SRB 14, which exhibits about 1% compressive strain for the pFETs.

It should be apparent that a non-limiting aspect of this invention provides a method that includes forming a set of fins (e.g., the SiGe fins 18) in a top portion of a semiconductor layer (e.g., the SRB 14), where the set of fins are comprised of a first semiconductor material (e.g., the SiGe of the SRB 14) that is covered at least on vertical side surfaces thereof by an oxide (e.g., the thermal oxide layer 21). The method further includes masking a first sub-set of the set of fins (in the PFET 20A region) and forming a plurality of voids (also referred to herein as oxide molds 26) in the oxide by removing a second sub-set of the set of fins (those fins in the NFET region 20B). Each void has a three-dimensional shape and dimensions that correspond to a three dimensional shape and dimensions of a corresponding removed fin from the second sub-set of fins. The method further includes epitaxially growing in the voids (in the oxide molds 26) a third sub-set of fins (e.g., the s-Si fins 28). The third sub-set of fins is comprised of a second semiconductor material that differs from the first semiconductor material. In accordance with a non-limiting aspect of this invention each fin of the third subset of fins has a three dimensional shape and dimensions of a corresponding removed fin from the second sub-set of fins.

It is to be understood that although the exemplary embodiments discussed above with reference to FIGS. 1-7 can be used on common variants of FET devices including, e.g., FET devices with multi-fingered FIN and/or gate structures and FET devices of varying gate width and length. Moreover, transistor devices can be connected to metalized pads or other devices by, for example, conventional ultra-large-scale integration (ULSI) metalization and lithographic techniques.

It is noted that any one of the structures shown in FIGS. 1-7 could be viewed as an intermediate structure formed during the overall process of providing the Fins 22 and 28 on the common substrate 10.

Integrated circuit dies can be fabricated with various devices such as a field-effect transistors, bipolar transistors, metal-oxide-semiconductor transistors, diodes, resistors, capacitors, inductors, etc. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes and etching processes may be used by those skilled in the art. Further, the exemplary embodiments are not intended to be limited to only those specific materials, metals, insulators, dopants, dopant concentrations, Ge concentrations, layer thicknesses and the like that were specifically disclosed above. Any and all such and similar modifications of the teachings of this invention will still fall within the scope of this invention.

What is claimed is:

1. A structure, comprising:
   a strain relaxed buffer disposed on a surface of a substrate;
   a set of fins disposed on a surface of the strain relaxed buffer, the set of fins comprised of a first subset of fins comprised of s-$Si_{1-x}Ge_x$ and a second subset of fins comprised of s-Si, where the strain relaxed buffer is comprised of $Si_{1-x}Ge_x$, where x has a non-zero value=n, where the first subset of fins are comprised of $Si_{1-x}Ge_x$ where x in the first subset of fins has a value=m, where m>n; and
   a layer disposed in a top surface portion of the strain relaxed buffer of $Si_{1-x}Ge_x$, the layer being disposed at least between individual fins of the set of fins, where x in the layer has the value=m.

2. The structure as in claim 1, where n is equal to about 0.25, and where m is equal to about 0.50.

3. The structure as in claim 1, further comprising a counter-doped region at a bottom portion of each individual one of the set of fins to provide electrical isolation.

* * * * *